United States Patent
Choi et al.

(10) Patent No.: US 9,847,122 B2
(45) Date of Patent: Dec. 19, 2017

(54) MULTI-BIT MEMORY DEVICE AND ON-CHIP BUFFERED PROGRAM METHOD THEREOF

(71) Applicant: SAMSUNG ELECTRONICS CO., LTD., Gyeonggi-do (KR)

(72) Inventors: Wan-Soo Choi, Gyeonggi-do (KR); Taec-Jun Kim, Seoul (KR); Sang-Wook Nam, Seoul (KR); Jae-Hwa Lee, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 86 days.

(21) Appl. No.: 14/451,953

(22) Filed: Aug. 5, 2014

(65) Prior Publication Data

US 2015/0046638 A1 Feb. 12, 2015

(30) Foreign Application Priority Data

Aug. 9, 2013 (KR) .................. 10-2013-0094978

(51) Int. Cl.
*G11C 16/10* (2006.01)
*G11C 11/56* (2006.01)
*G11C 16/06* (2006.01)
*G11C 16/34* (2006.01)

(52) U.S. Cl.
CPC .......... *G11C 11/5628* (2013.01); *G11C 16/06* (2013.01); *G11C 16/10* (2013.01); *G11C 16/3418* (2013.01)

(58) Field of Classification Search
CPC ............... G11C 11/5628; G11C 16/10; G11C 2211/5641; G11C 2211/5621; G11C 16/34; G11C 2211/5648; G11C 13/0069; G11C 7/106; G11C 7/1087; G06F 3/0619; G06F 11/008; G06F 3/0683; G06F 2212/7203; G06F 3/0656; G06F 12/0246; G06F 3/065

See application file for complete search history.

(56) References Cited

U.S. PATENT DOCUMENTS

| | | | |
|---|---|---|---|
| 7,508,732 B2 | 3/2009 | Park et al. | |
| 7,876,613 B2 | 1/2011 | Kang et al. | |
| 8,223,542 B2 | 7/2012 | Takagiwa | |
| 8,248,850 B2 | 8/2012 | Dutta et al. | |

(Continued)

FOREIGN PATENT DOCUMENTS

| | | |
|---|---|---|
| KR | 1020110094289 | 8/2011 |
| KR | 1020120005844 | 1/2012 |

*Primary Examiner* — David X Yi
*Assistant Examiner* — Candice Rankin
(74) *Attorney, Agent, or Firm* — F. Chau & Associates, LLC

(57) ABSTRACT

A program method of a multi-bit memory device is provided. First page data is programmed in a first region of a memory cell array. The first page data is stored in a first buffer of a page buffer. Second page data is programmed in the first region of the memory cell array. The second page data is stored in a third buffer of the page buffer. Third page data is stored in the first region of the memory cell array. The second page data stored in the third buffer is transferred to a second buffer of the page buffer and the third page data is stored in the third buffer. The first to third page data stored in page buffer are programmed in a second region of the memory cell array.

12 Claims, 12 Drawing Sheets

(56) References Cited

U.S. PATENT DOCUMENTS

| | | | |
|---|---|---|---|
| 8,264,883 B2 | 9/2012 | Lim et al. | |
| 8,274,825 B2 | 9/2012 | Pyeon | |
| 8,307,241 B2 | 11/2012 | Avila et al. | |
| 8,395,944 B2 | 3/2013 | Yoon | |
| 8,897,066 B2* | 11/2014 | Jung | G11C 11/5628 365/185.02 |
| 2007/0285980 A1* | 12/2007 | Shimizu | G11C 11/5628 365/185.03 |
| 2008/0094893 A1* | 4/2008 | Choi | G06F 11/1072 365/185.03 |
| 2010/0080059 A1* | 4/2010 | Chen | G11C 11/5628 365/185.12 |
| 2010/0309725 A1* | 12/2010 | Huh | G11C 16/06 365/185.12 |
| 2012/0134214 A1* | 5/2012 | Joo | G11C 11/5628 365/185.19 |
| 2012/0203959 A1 | 8/2012 | Yoon et al. | |
| 2012/0284587 A1* | 11/2012 | Yu | G06F 3/0608 714/773 |

* cited by examiner

1st PGM

Coarse PGM

MULTI-BIT MEMORY DEVICE AND ON-CHIP BUFFERED PROGRAM METHOD THEREOF

CROSS-REFERENCE TO RELATED APPLICATION

This application claims priority under 35 U.S.C. §119 to Korean Patent Application No. 10-2013-0094978, filed on Aug. 9, 2013 in the Korean Intellectual Property Office, the disclosure of which is incorporated by reference herein in its entirety.

TECHNICAL FIELD

The present invention relates to a multi-bit memory device and an on-chip buffered program method thereof.

DISCUSSION OF RELATED ART

Semiconductor memory devices include volatile memory devices and non-volatile memory devices. Volatile memory devices operate fast but lose stored data when power is not supplied thereto. Non-volatile memory devices retain stored data when power is not supplied thereto. Non-volatile memories include single-bit memory devices whose a unit memory cell stores an 1-bit data and multi-bit memory devices whose a unit memory cell stores multi-level data representing two or more bit data.

SUMMARY

According to an exemplary embodiment of the present inventive concept, a program method of a multi-hit memory device is provided. First page data is programmed in a first region of a memory cell array. The first page data is stored in a first buffer of a page buffer. Second page data is programmed in the first region of the memory cell array. The second page data is stored in a third buffer of the page buffer. Third page data is stored in the first region of the memory cell array. The second page data stored in the third buffer is transferred to a second buffer of the page buffer and the third page data is stored in the third buffer. The first to third page data stored in page buffer are programmed in a second region of the memory cell array.

According to an exemplary embodiment of the present inventive concept, a program method of a multi-bit memory device is provided. A first data including at least three 1-bit data is received. The first data is stored in a first memory cell array region and a page buffer. The first memory cell array region includes a plurality of memory cells whose each memory cell is configured to store an 1-bit data. A first programming operation is performed on a second memory cell array region based on the first data stored in the page buffer. The second memory cell array region includes a plurality of memory cells whose each memory cell is configured to store a multi-level data representing the first data. A second programming operation is performed on the second memory cell array region based on the first data stored in the first memory cell array region.

According to an exemplary embodiment of the present inventive concept, a multi-bit memory device is provided. The multi-bit memory device includes first and second memory cell array regions and a page buffer. The first memory cell array region stores a page data. The page buffer stores the page data stored in the first memory cell array region. The second memory cell array region includes a memory cell configured to be programmed using the page data stored in the page buffer.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
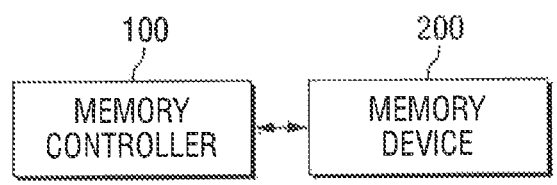
FIG. 1 is a block diagram of a multi-bit memory system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being on another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram of a multi-bit memory system according to an exemplary embodiment of the present inventive concept.

Referring to FIG. 1, the multi-bit memory system 1 includes a memory controller 100 and a memory device 200.

The memory controller 100 may be configured to control the memory device 200 in response to a request from a host (not shown). For example, the memory controller 100 may be configured to control program/read/erase operations of the memory device 200. The memory controller 100 may be configured to drive firmware for controlling the memory device 200.

The memory device 200, including a plurality of memory cells, may be configured to store data. For example, the memory device 200 may be a multi-bit memory device storing M-bit data, where M is a natural number of 3 or greater. The memory device 200 may be programmed using an on-chip buffered program algorithm according to an exemplary embodiment. In the on-chip buffered program algorithm, a partial space of the memory device 200 is used as a buffer memory. The memory device 200 may be provided as a nonvolatile memory device.

Figure 2:
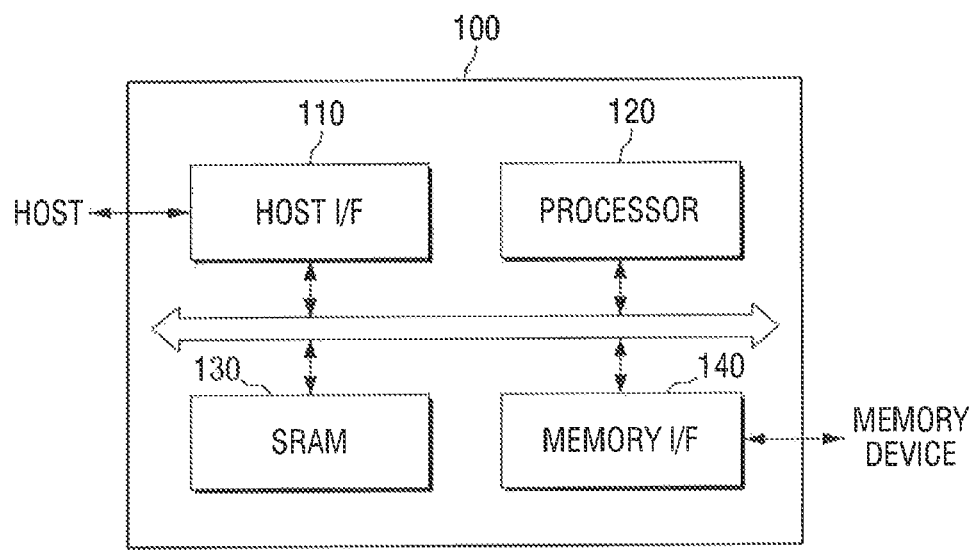
FIG. 2 is a block diagram of the memory controller of FIG. 1 according to an exemplary embodiment of the present inventive concept.

FIG. 2 is a block diagram of the memory controller of FIG. 1 according to an exemplary embodiment of the present inventive concept.

Referring to FIG. 2, the memory controller 100 includes a host interface (I/F) 110, a processor 120, a buffer memory 130, and a memory interface (I/F) 140.

The host interface 110 may be operated using a protocol for exchanging data between a host and the controller. For example, the protocol may include various standardized interface protocols such as Universal Serial Bus (USB), Multimedia Card (MMC), Peripheral Component Interconnection (PCI), PCI-Express (PCI-E), Advanced Technology Attachment (ATA, Parallel-ATA, pATA), Serial-ATA (SATA), Small Computer Small Interface (SCSI), Enhanced Small Disk Interface (ESDI), or Integrated Drive Electronics (IDE).

The processor 120 may be configured to control the overall operation of the memory controller 100.

The buffer memory 130 may receive data to be programmed to the memory device 200 from the host and may temporarily store the received data. In a program operation, the data temporarily stored in the buffer memory 130 may be programmed to the memory device 200. The buffer memory 130 may receive data read from the memory device 200 and may temporarily store the received data. For example, the buffer memory 130 may employ a static random access memory (SRAM), but the present inventive concept is not limited thereto.

The memory interface 140 is configured to interface communications between the memory controller 100 and the memory device 200. For example, the memory interface 140 may be configured to include an NAND interface protocol, but the present inventive concept is not limited thereto.

Although not shown in FIG. 2, the memory controller 100 may further include an error correction block. The error correction block may be configured to detect an error of data read from a memory device and to correct the detected error using an error correction code (FCC). The error correction block may be provided as a component of the memory controller 100. Alternatively, the error correction block may be provided as a component of the memory device 200.

Figure 3:
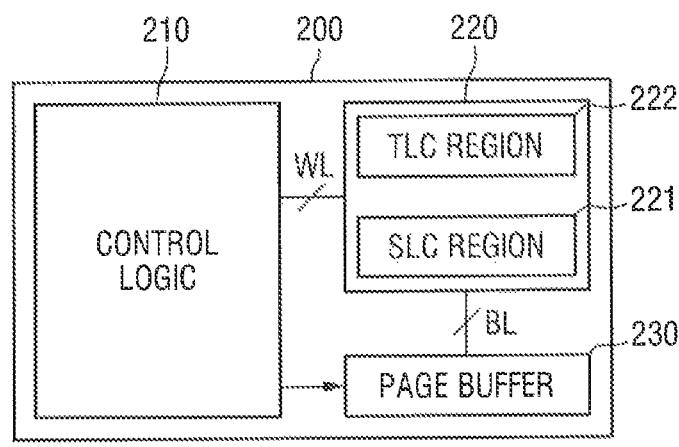
FIG. 3 is a block diagram of the memory device of FIG. 1 according to an exemplary embodiment of the present inventive concept.

FIG. 3 is a block diagram of the memory device of FIG. 1 according to an exemplary embodiment of the present inventive concept.

Referring to FIG. 3, the memory device 200 includes a control logic 210, a memory cell array 220, and a page buffer 230.

The control logic 210 may be configured to control the overall operation of the memory device 200.

The memory cell array 220 is provided as a storage space for storing data. The memory cell array 220 is connected to the control logic 210 through a word line WL and is further connected to the page buffer 230 through a bit line BL.

The memory cell array 220 includes a first region 221 and a second region 222. The first region 221 includes memory cells configured to store 1-bit data. The second region 222 includes memory cells configured to store M-bit data, where M is a natural number of 3 or greater. The memory cells of the first region 221 may be referred to as a single level cell (SLC) region, and the memory cells of the second region 222 may be referred to as a triple level cell (TLC) region. The SLC region 221 and the TLC region 222 may be physically or logically separated from each other.

As described above, according to an on-chip buffered program algorithm, the program of the memory device 200 may include a buffer program operation in which data to be programmed in the TLC region 222 is first programmed in the SLC region 221, and then a main program in which data is programmed in the TLC region 222.

Each of the SLC region 221 and the TLC region 222 may include a plurality of memory blocks. A plurality of memory cells are arranged in a plurality of rows and a plurality of columns to constitute the plurality of memory blocks. The plurality of memory cells may have a 2-dimensional cell array structure or a 3-dimensional cell array structure, but the present inventive concept is not limited thereto. In the SLC region 221, a program or read operation may be performed in a single page. In the TLC region 222, a program or read operation of the TLC region 222 may be performed in multiple pages.

The page buffer 230 may program data in the memory cell array 220 or may read data from the memory cell array 220 in response to a request from the control logic 210. For example, the page buffer 230 may operate as a write driver or a sense amplifier according to the operation of the memory device 200. In a programming operation of the memory device 200, the page buffer 230 may temporarily store page data to be programmed in the memory cell array 220. In a read operation of the memory device 200, the page buffer 230 may temporarily store page data read from the memory cell array 220.

Figure 4:
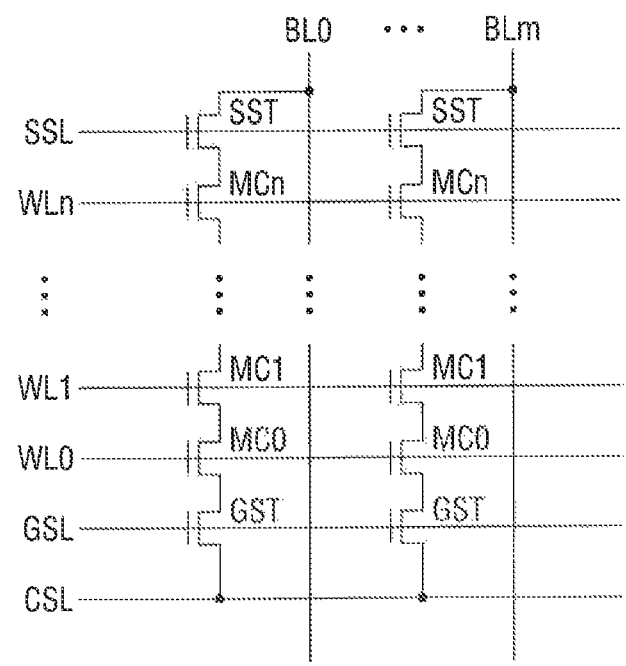
FIG. 4 is a circuit diagram illustrating a memory block of a memory cell array in FIG. 3 according to an exemplary embodiment of the inventive concept.

FIG. 4 is a circuit diagram illustrating a memory block of a memory cell array in FIG. 3 according to an exemplary embodiment of the present inventive concept.

Referring to FIG. 4, the memory block includes a NAND string structure. For example, the SLC region 221 and the TLC region 222 include the NAND string structure of FIG. 4.

The memory block includes a plurality of strings corresponding to a plurality of columns or bit lines BL0 to BLm. Each of the plurality of strings includes a string select transistor SST, a plurality of memory cells MC0 to MCn, and a ground select transistor GST. In each string, a drain of the string select transistor SST is connected to the ground select transistor GST and a source of the ground select transistor GST is connected to a common source line CSL.

A plurality of memory cells MC0 to MCn is connected in series between a source of the string select transistor SST and a drain of the ground select transistor GST. Gates of the memory cells arranged in the same row are connected in common to the corresponding word lines WL0-WLn. The string select transistor SST is controlled by a voltage applied through a string select line SSL and the ground select transistor GST is controlled by a voltage applied through a ground select line GSL. The memory cells MC0 to MCn are controlled by voltages applied through the corresponding word lines WL0 to WLn. The memory cells connected to the respective word lines WL0 to WLn store data corresponding to a single page or multiple pages.

Figure 5A:
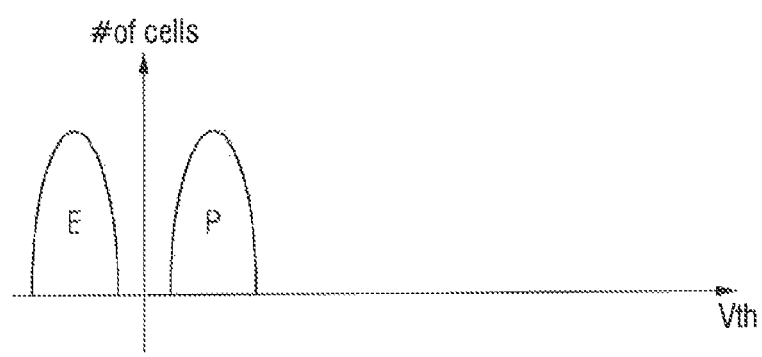
FIG. 5A illustrates a program state of a single level cell (SLC) region of FIG. 3.
Figure 5B:
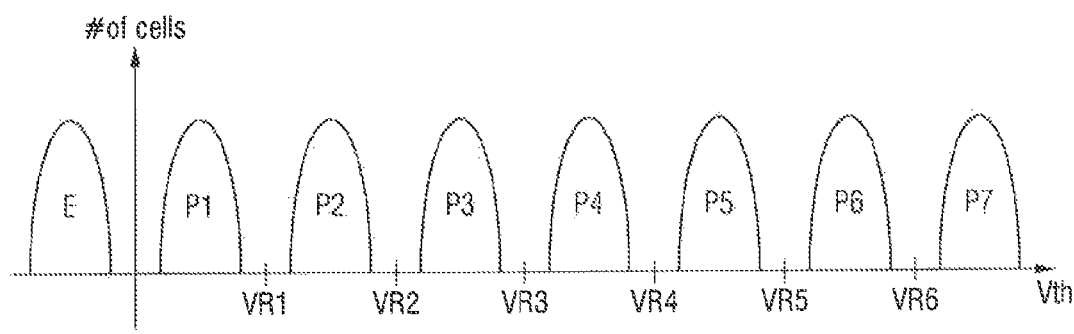
FIG. 5B illustrates a program state of a triple level cell (TLC) region of FIG. 3.

FIG. 5A illustrates a program state of an SLC region of FIG. 3 and FIG. 5B illustrates a program state of a TLC region of FIG. 3.

Referring to FIG. 5A, memory cells in the SLC region 221 have one of programs states "E (Erase)" and "P (Program)." The memory cells have a voltage distribution corresponding to the program state. In such a manner, each of the memory cells in the SLC region 221 stores 1-bit data.

Memory cells in the TLC region 222 have one of program states "E", "P1", "P2", "P3", "P4", "P5", "P6", and "P7," The memory cells have a voltage distribution corresponding to the program state. The respective program states may be distinguished from each other using the respective threshold voltages VR1 to VR6. In such a manner, each of the memory cells in the TLC region 222 stores 3-bit data.

In FIGS. 5A and 5B, the memory cells in the SLC region 221 storing 1-bit data and the memory cells in the TLC region 222 storing 3-bit data are exemplified, but the present inventive concept is not limited thereto. The memory cells in the TLC region 222 may store 4 or more bit data.

The threshold voltage distributions of FIGS. 5A and 5B may be modified in various manners.

Figure 6:
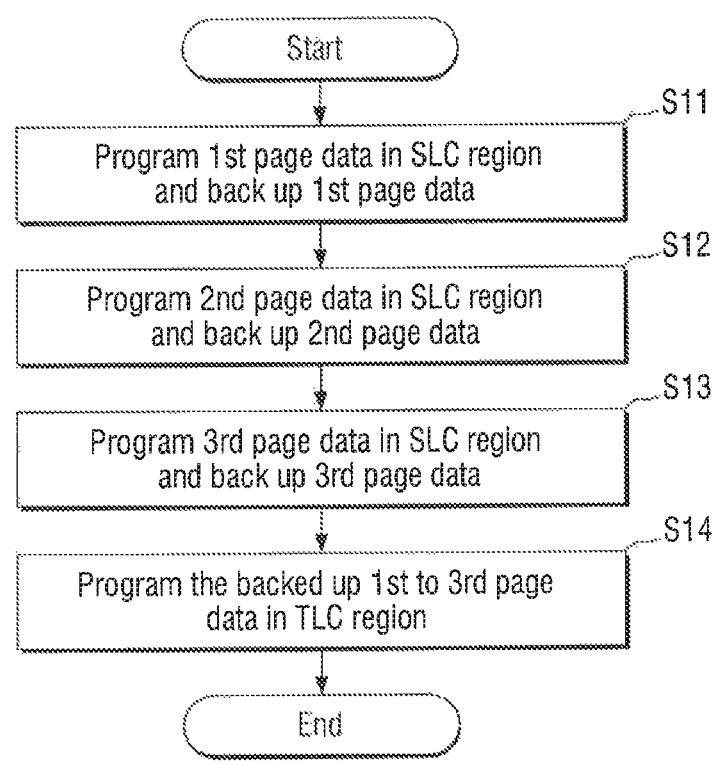
FIG. 6 is a flowchart illustrating a method of programming a multi-bit memory device according to an exemplary embodiment of the present inventive concept.
Figure 7:
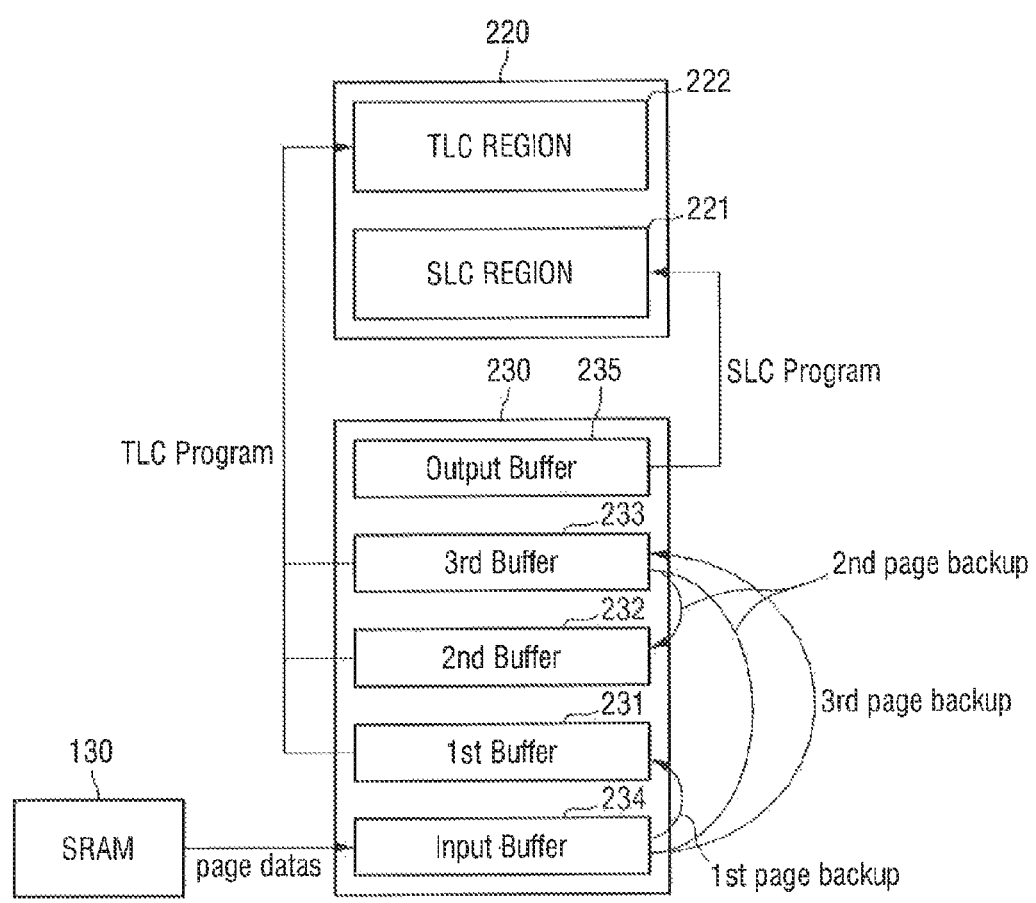
FIG. 7 illustrates transfer of page data occurred in performing the method of programming the multi-bit memory device of FIG. 6 according to an exemplary embodiment of the present inventive concept.

FIG. 6 is a flowchart illustrating a method of programming a multi-hit memory device according to an exemplary embodiment of the present inventive concept. FIG. 7 illustrates transfer of page data occurred in performing the programming method of FIG. 6 according to an exemplary embodiment of the present inventive concept.

Referring to FIG. 7, a page buffer 230 includes a plurality of buffers. Each of the plurality of buffers stores single page data. Each of plurality of buffers temporarily stores page data to be programmed in a selected memory cell or page data read from the selected memory cell. The plurality of buffers is connected to each other to exchange page data. For example, the plurality of buffers may be configured using latches, but the present inventive concept is not limited thereto.

Referring to FIGS. 6 and 7, first page data transmitted from a SRAM device 130 is first programmed in an SLC region 221 and then stored in a first buffer 231 (S11). For example, the first page data transmitted from the SRAM device 130 is temporarily stored in an input buffer 234. The first page data stored in the input buffer 234 is transferred to an output buffer 235 through a second buffer 232. The first page data stored in the output buffer 235 is programmed in the SLC region 221. Thereafter, the first page data input of the input buffer 234 is stored in the first buffer 231.

Next, second page data transmitted from the SRAM device 130 is programmed in the SLC region 221 and then stored in a third buffer 233 (S12). Similar to programming the first page data in the SLC region 221, the second page data is programmed in the SLC region 221 using the input buffer 234, the second buffer 232 and the output buffer 235. Thereafter, the second page data input of the input buffer 234 is temporarily stored in the third buffer 233. This is because if the second page data is stored in the second buffer 232 after the programming of the second page data, the second page data may be lost in programming third page data that will be described below.

Next, the third page data is programmed in the SLC region 221. After the programming of the third page data, the second page data temporarily stored in the third buffer 233 is transferred to the second buffer 232, and the third page data is stored in the third buffer 233 (S13). Similar to the programming of the first page data in the SLC region 221, the third page data is also programmed in the SLC region 221 using the input buffer 234, the second buffer 232 and the output buffer 235. Next, the second page data temporarily stored in the third buffer 233 is transferred to the second buffer 232, and the second page data is stored in the second buffer 232. Then, the third page data of the input buffer 234 is stored in the third buffer 233.

Next, the first to third page data stored in the first to third buffers 231 to 233 are programmed in the TLC region 222 (S14). The program of the TLC region 222 is performed in multiple pages. For example, the first to third page data are programmed together in the TLC region 222.

The page data to be programmed in the SLC region 221 may be provided from the SRAM device 130 to the input buffer 234. As described above, the SRAM 130 may receive the page data to be programmed in the SLC region 221 from a host and may temporarily store the received page data. The SRAM device 130 is included in the memory controller 100 as shown in FIG. 2.

Figure 8A:
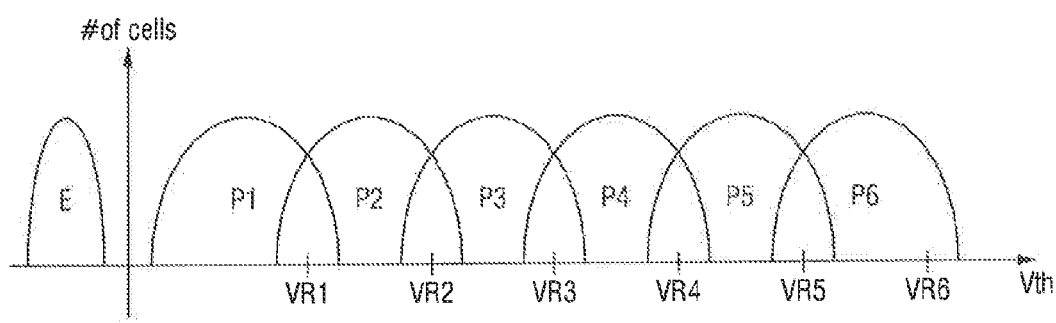
FIGS. 8A to 8C illustrate a program method of the TLC region of FIG. 3.
Figure 8B:
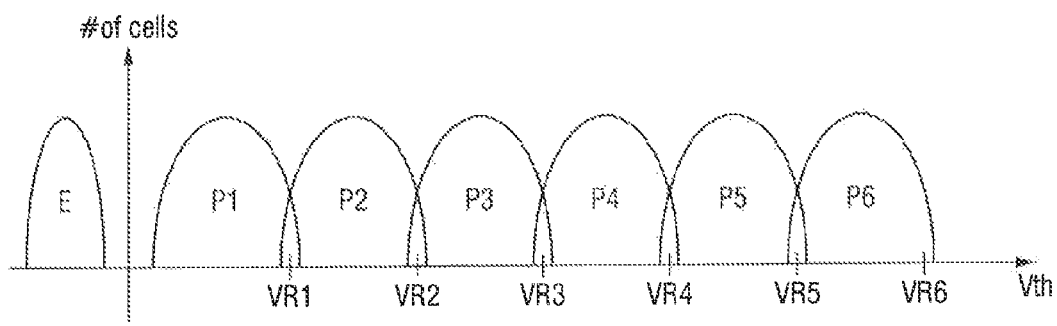
Figure 8C:
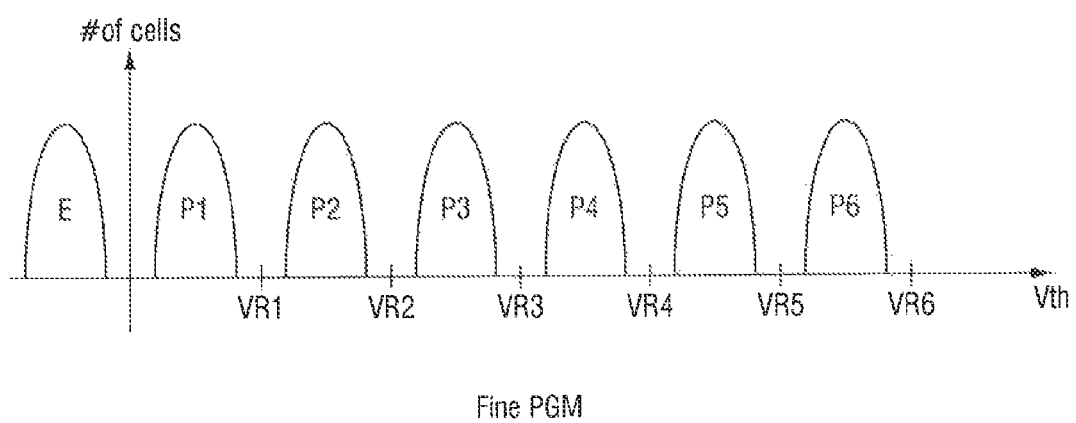

FIGS. 8A to 8C illustrate a program method of the TLC region of FIG. 3 according to an exemplary embodiment of the present inventive concept.

The multiple program states of the memory cells in the TLC may be programmed using an incremental step pulse program (ISPP) algorithm (or a reprogram algorithm). According to the ISPP algorithm, multiple programs are performed to make threshold voltages of each program state densely distributed.

Referring to FIG. 8A, threshold voltage distributions of memory cells after performing a first program are illustrated. After the first program is performed, the threshold voltage distributions of the program states "P1" to "P6" are overlapped with one another. For example, the threshold voltage distribution of a first program state "P1" and the threshold voltage distribution of a second program state "P2" have an overlapping portion at a threshold voltage VR1.

Referring to FIG. 8B, threshold voltage distributions of memory cells after performing a second program (or a coarse program) are illustrated. After the second program is performed, the overlapping portions between two adjacent threshold voltage distributions are reduced compared to the overlapping portions of FIG. 8A.

Referring to FIG. 8C, threshold voltage distributions of memory cells after performing a third program (or a fine program) are illustrated. After the third program is performed, the program states "P1" to "P6" have final threshold voltage distributions distinguished from one another.

As described above, the program of the TLC region 222 may be completed by performing the third program, and memory cells of the TLC region 222 may have final threshold voltage distributions distinguished from one another. For example, the first to third page data stored in the buffer 230 are stored in the TLC region 222 and thus a selected memory cell of the TCL region 222 has a threshold value positioned in one of the threshold distributions of FIG. 8C according to the first to third page data.

Figure 9:
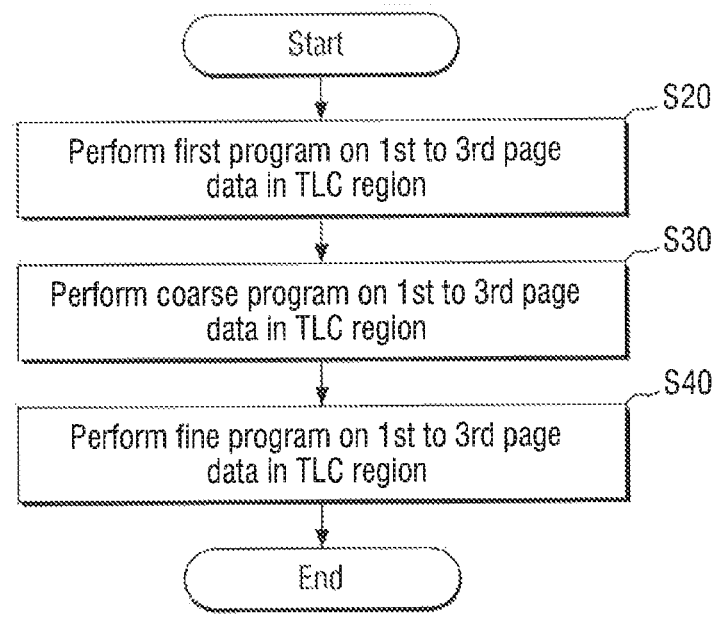
FIG. 9 is a flowchart illustrating a method of programming the multi-bit memory device of FIG. 6 according to an exemplary embodiment of the present inventive concept.

FIG. 9 is a flowchart illustrating a method of programming the multi-bit memory device of FIG. 6 according to an exemplary embodiment of the present inventive concept.

Referring to FIG. 9, a first program is performed on the TLC region 222 based on the first to third page data (S20). For example, the first program is performed using the first to third page data stored in the page buffer 230.

Next, a coarse program is performed on the TLC region 222 (S30) that was programmed in the first program (S20). The coarse program may be referred to as a second program. Then, a fine program is performed on the TLC region 222 (840) that was programmed using the coarse program (830). The fine program may be referred to as a third program. The coarse or fine program is performed using the first to third page data read from the SLC region 221. When the memory cells of the TLC region 222 are subject to the first program, coarse program and fine program, the threshold voltages of the memory cells in the TLC region 222 change as shown in FIGS. 8A to 8C.

Figure 10:
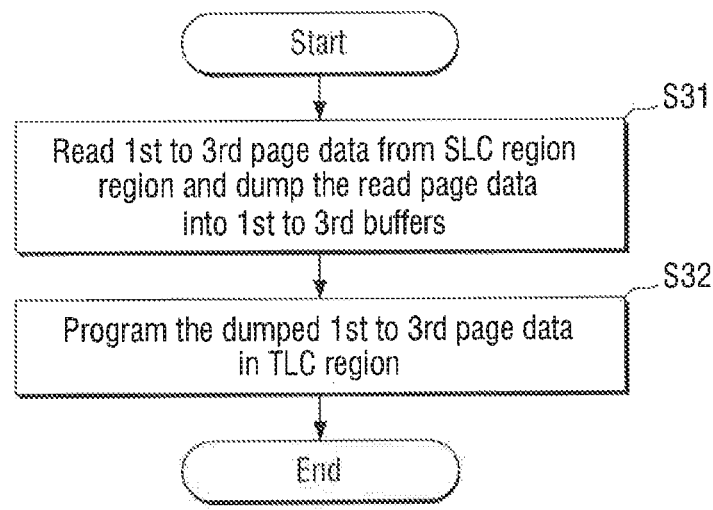
FIG. 10 is a flowchart illustrating a method of performing the programming method of FIG. 9 according to an exemplary embodiment of the present inventive concept.
Figure 11:
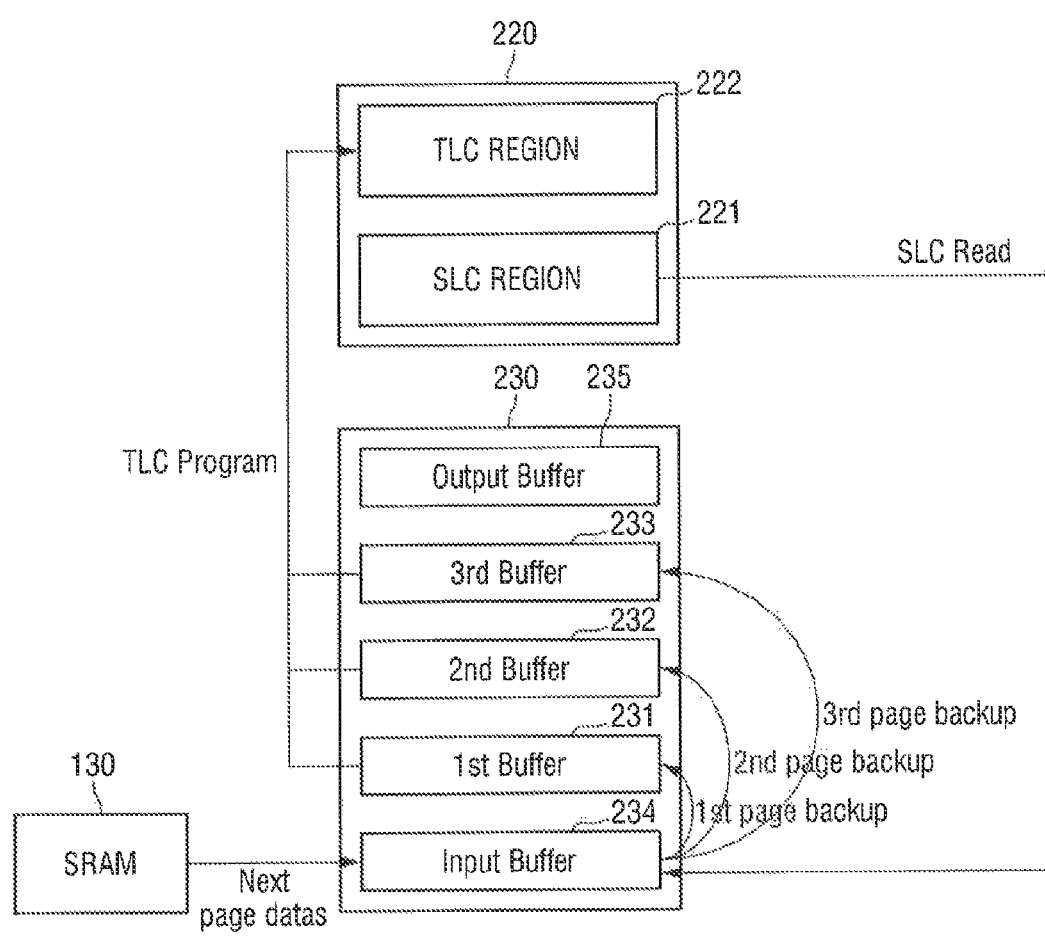
FIG. 11 illustrates transfer of page data occurred in performing the method of programming of FIG. 9.

FIG. 10 is a flowchart illustrating the coarse program of FIG. 9 according to an exemplary embodiment of the inventive concept, and FIG. 11 illustrates transfer of page data occurred in performing the method of the second program of FIG. 9.

Referring to FIGS. 10 and 11, the first to third page data are first read from the SLC region 221 and then are stored in the first to third buffers 231 to 233 (S31). For example, the first page data is read from the SLC region 221, and the first page data is stored in the input buffer 234. The first page data input to the input buffer 234 is stored in the first buffer 231. Thereafter, similar to the transfer of the first page data as described above, the second and third page data are sequentially stored in the second and third buffers 232 and 233, respectively, through the input buffer 234.

Next, the first to third page data stored in the first to third buffers 231 to 233 are programmed in the TLC region 222 (S32).

After the first program is performed, the next page data may be provided from the SRAM 130 to the input buffer 234. Then, according to the program sequence, a buffer program (and the first program of the main program) of the next page data may be performed before a second program of the current page data is performed. In this case, since the next page data is loaded into the page buffer 230, the current page data stored in the page buffer 230 is lost. Therefore, to perform the second and third programs of the current page data, it is necessary to read the current page data from the SLC region 221.

The third program of FIG. 9 may be performed in substantially the same manner as the second program shown in FIGS. 10 and 11.

Figure 12:
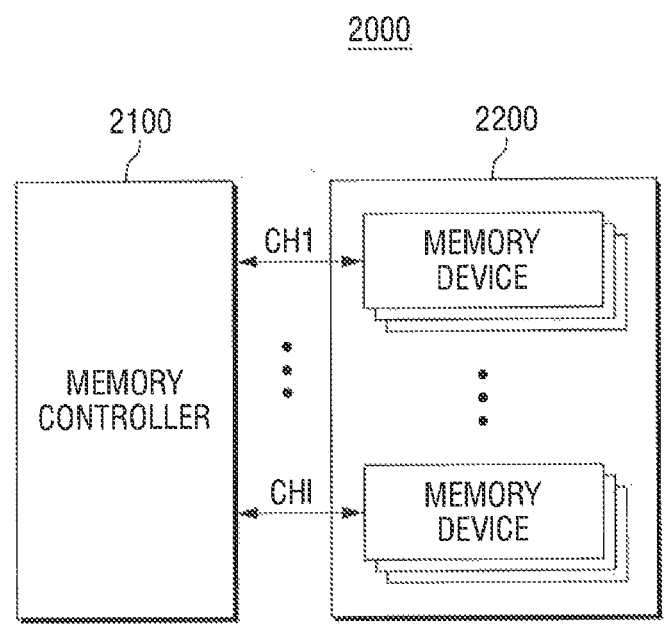
FIG. 12 is a block diagram illustrating a multi-bit memory system according to an exemplary embodiment of the present inventive concept.

FIG. 12 is a block diagram illustrating a multi-bit memory system according to an exemplary embodiment of the present inventive concept. For the sake of convenient explanation, the following description will focus on differences between the multi-bit memory systems shown in FIGS. 1 and 12.

Referring to FIG. 12, the multi-bit memory system 2000 includes a memory controller 100, and a memory device 2200.

The memory device 2200 includes a plurality of memory chips. The plurality of memory chips is divided into a plurality of groups. Each of the respective groups of the plurality of memory chips operates under the control of the memory controller 2100 through one of common channels CH1 to CHi.

Each memory chip may have substantially the same configuration as the memory device 200 of FIG. 1. In performing the first program of the main program, the plurality of memory chips may use multiple page data stored in a page buffer.

Each channel is connected to a plurality of memory devices. Alternatively, one memory chip is connected to a single channel.

In the on-chip buffered program method of the aforementioned multi-bit memory device, page data is not read from the SLC region 221 and the page data stored in the page buffer 230 is used during the first program of the main program. Therefore, a latency required for reading the page data from the SLC region 221 is reduced, thereby increasing program performance of the multi-bit memory device.

For example, the memory systems 1 and 2000 of FIGS. 1 and 12 may be applied to a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional television, a digital audio recorder, a digital audio player, a digital picture recorder, a digital picture player, digital video recorder, a digital video player, a device capable of transmitting/receiving information in wireless environments, home network electronic devices, computer network electronic devices, telematics network electronic devices, RFID devices, or embedded systems, but not limited thereto.

Figure 13:
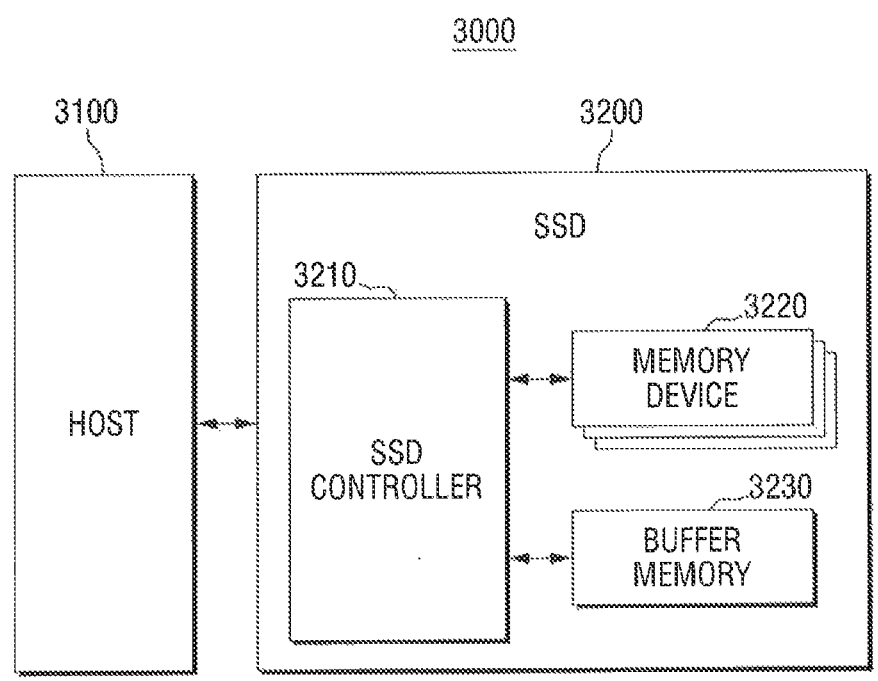
FIG. 13 is a block diagram illustrating an application system including a solid state drive (SSD) according to an exemplary embodiment of the present inventive concept.

FIG. 13 is a block diagram illustrating an application system including a solid state drive (SSD) according to an exemplary embodiment of the present inventive concept.

Referring to FIG. 13, the application system 3000 includes a host 3100 and a solid state drive (SSD) 3200.

The SSD 3200 includes an SSD controller 3210, a memory device 3220, and a buffer memory 3230.

The SSD controller 3210 communicates with the host 3100. The SSD controller 3210 accesses the memory device 3220 in response to a request from the host 3100. The SSD controller 3210 stores the data received from the host 3100 to the buffer memory 3230.

The memory device 3220 serves as a storage medium of the SSD 3200. The memory device 3220 includes a plurality of memory chips. The plurality of memory chips may be substantially the same configuration as the memory device 200 of FIG. 1. In performing the first program of the main program, the plurality of memory chips may use multiple page data stored in the page buffer.

The buffer memory 3230 temporarily stores data received from the SSD controller 3210. When the memory device 3220 performs a program, the buffer memory 3230 transfers the temporarily stored data to the memory device 3220. The buffer memory 3230 may include a synchronous DRAM (SDRAM), but the present inventive concept is not limited thereto.

The buffer memory 3230 is positioned outside the SSD controller 3210, but the present inventive concept is not limited thereto. For example, the buffer memory 3230 may be integrated with the SSD controller 3210 in a single chip.

Figure 14:
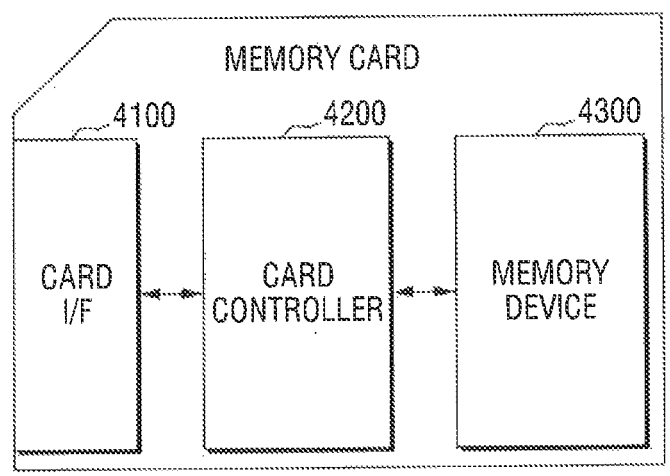
FIG. 14 is a block diagram illustrating a memory card including a multi-bit memory device according to an exemplary embodiment of the present inventive concept.

FIG. 14 is a block diagram illustrating a memory card including a multi-bit memory device according to an exemplary embodiment of the present inventive concept.

Referring to FIG. 14, the memory card 4000 includes a card interface (I/F) 4100, a card controller 4200, and a memory device 4300.

The card interface 4100 may include a plurality of pins to interface with a host. The plurality of pins may include, but not limited to, command pins, data pins, clock pins, power pins, and so on. The number of pins may vary according to the kind of the memory card 4000.

The card controller 4200 may be configured to write data to the memory device 4300 or may read data from the memory device 4300 in response to a request from the host.

The memory device 4300 may be substantially the same configuration as the memory device 200 of FIG. 1. In performing a first program of a main program, the memory device 4300 may use multiple page data stored in a page buffer.

For example, the memory card 4000 may include a PC card (for example, PCMCIA), a compact flash card (CF), a smart media card (SM/SMC), a memory stick, a multimedia card (for example, MMC, RS-MMC and MMCmicro), an SD card (for example, SD, miniSD and microSD), or a universal flash memory device (for example, UFS).

Figure 15:
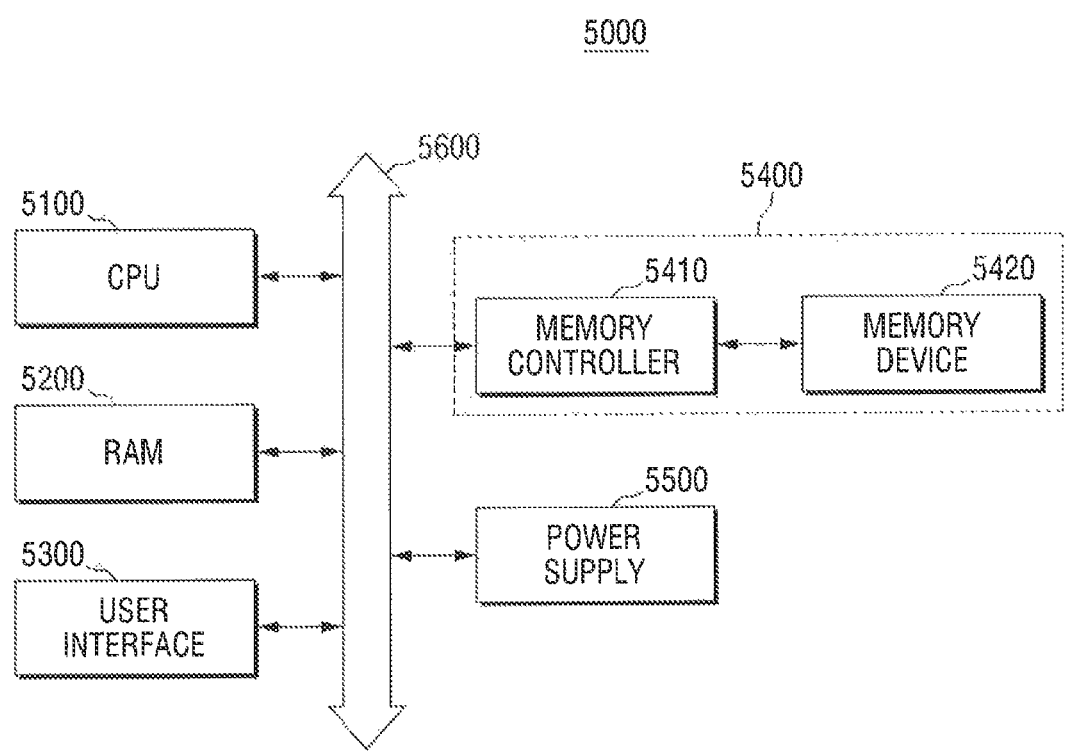
FIG. 15 is a block diagram illustrating a computing system including a multi-bit memory device according to an exemplary embodiment of the present inventive concept.

FIG. 15 is a block diagram illustrating a computing system including a multi-bit memory device according to an exemplary embodiment.

Referring to FIG. 15, the computing system 5000 includes a central processing unit (CPU) 5100, a random access memory (RAM) 5200, a user interface 5300, a memory system 5400 and a power supply 5500.

The memory system 5400 is connected to the CPU 5100, the RAM 5200, the user interface 5300 and the power supply 5500 through a system bus 5600

The memory system 5400 may be substantially the same configuration as the memory device 200 of FIG. 1. The memory system 5400 may be substantially the same configuration as the memory system of FIG. 12. Data provided through the user interface 5300 or processed by the CPU 5100 is stored in the memory system 5400.

The memory device 5420 is connected to the system bus 5600 through the memory controller 5410, but the present inventive concept is not limited thereto. For example, the memory device 5410 may be directly connected to the system bus 5600.

Meanwhile, the computing system 5000 may be configured to include both of the memory systems 1 and 2000 of FIGS. 1 and 12.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A program method of a multi-bit memory device, the program method comprising:
   programming first page data in a first region of a memory cell array;
   after the programming of the first page data, storing the first page data in a first buffer of a page buffer;
   after the storing of the first page data, programming second page data in the first region of the memory cell array;
   after the programming of the second page data, storing the second page data in a third buffer of the page buffer;
   after the storing of the second page data, programming third page data in the first region of the memory cell array;
   after programming of the third page data, transferring the second page data stored in the third buffer to a second buffer of the page buffer and then storing the third page data in the third buffer; and
   performing, based on the first to third page data stored in the page buffer, a first programming operation on a second region of the memory cell array,
   wherein the first region of the memory cell array includes a memory cell configured to store 1-bit data, and
   wherein the second region of the memory cell array includes a memory cell configured to store M-bit data, where M is a natural number of 3 or greater.

2. The program method of claim 1,
   wherein the programming of the first to third page data in the first region of the memory cell array comprises temporarily storing the first to third page data to an input buffer of the page buffer and then transferring the first to third page data stored in the input buffer to the second buffer.

3. The program method of claim 2,
   wherein the programming of the first to third page data in the first region of the memory cell array further comprises transferring the first to third page data stored in the second buffer to an output buffer of the page buffer and programming the first region of the memory cell array based on the first to third page data transferred to the output buffer.

4. The program method of claim 2,
   wherein the storing of the first page data in the first buffer comprises transferring the first page data temporarily stored in the input buffer to the first buffer.

5. The program method of claim 2,
   wherein the storing of the second and third page data in the third buffer comprises transferring the second and third page data temporarily stored in the input buffer to the third buffer, respectively.

6. The program method of claim 1, further comprising:
   after the performing of the first programming operation, performing a second programming operation on the second region of the memory cell array based on the first to third data programmed in the first region of the memory cell array.

7. A memory device comprising:
   a memory cell array comprising a first region including memory cells configured to store 1-bit data and a second region including memory cells configured to store M-bit data, where M is a natural number of 3 or greater;
   a page buffer; and
   control logic configured to program first page data in the first region, store the first page data in a first buffer of the page buffer after the program of the first page data, program second page data in the first region after the store of the first page data, store the second page data in a third buffer of the page buffer after the program of the second page data, program third page data in the first region after the store of the second page data, and then after the program of the third page data, transfer the second page data stored in the third buffer to a second buffer of the page buffer and store the third page data in the third buffer, and perform a first programming operation on the second region based on the first to third page data stored in the page buffer.

8. The memory device of claim 7, wherein the first programming operation temporarily stores the first to third page data to an input buffer of the page buffer and then transfers the first to third page data stored in the input buffer to the second buffer.

9. The memory device of claim 8, the first programming operation further transfers the first to third page data stored in the second buffer to an output buffer of the page buffer and programs the first region based on the first to third page data transferred to the output buffer.

10. The memory device of claim 8, the control logic stores the first page data in the first buffer by transferring the first page data temporarily stored in the input buffer to the first buffer.

11. The memory device of claim 8, wherein the control logic stores the second and third page data in the third buffer by transferring the second and third page data temporarily stored in the input buffer to the third buffer, respectively.

12. The memory device of claim 7, wherein the control logic performs a second programming operation on the second region based on the first to third data programmed in the first region, after performing the first programming operation.

\* \* \* \* \*